(12) United States Patent
Nachumovsky

(10) Patent No.: US 6,174,758 B1
(45) Date of Patent: *Jan. 16, 2001

(54) SEMICONDUCTOR CHIP HAVING FIELDLESS ARRAY WITH SALICIDE GATES AND METHODS FOR MAKING SAME

(75) Inventor: Ishai Nachumovsky, Zichron Yaakov (IL)

(73) Assignee: Tower Semiconductor Ltd., Migdal Haemek (IL)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/261,706

(22) Filed: Mar. 3, 1999

(51) Int. Cl.[7] .................................. H01L 21/8238
(52) U.S. Cl. ................ 438/199; 438/201; 438/257; 438/258; 438/261; 438/262; 438/266; 257/369
(58) Field of Search ........................... 438/199–201, 438/261–266, 257–258

(56) References Cited

U.S. PATENT DOCUMENTS 5,219,775 * 6/1993 Saeki et al. .................. 437/43
5,610,420 * 3/1997 Kuroda et al. ................ 257/315
5,768,192   6/1998 Eitan .
5,966,603 * 10/1999 Eitan ........................... 438/258

* cited by examiner

*Primary Examiner*—Steven H. Loke
*Assistant Examiner*—Nitin Parekh
(74) *Attorney, Agent, or Firm*—Bever, Hoffman & Harms, LLP; Edward S. Mao

(57) ABSTRACT

A semiconductor process, which creates a semiconductor devices that includes logic transistors fabricated in a first region and a fieldless array fabricated in a second region, is provided. Both the logic transistors and the fieldless array transistors have gates comprising a polysilicon layer with a silicide layer. The logic transistors have self-aligned silicide regions formed on their source and drain regions. Self-aligned silicide regions are not formed on the source and drain regions of the fieldless array transistors, thereby preventing undesirable electrical shorts which could otherwise occur within the fieldless array. The silicide structures can be fabricated by depositing polysilicon over the first and second regions, etching the polysilicon layer in the first region to define gates of the logic transistors, depositing and reacting a refractory metal, removing the non-reacted refractory metal, and then patterning the polysilicon and silicide in the second region to define gates of the fieldless array transistors.

15 Claims, 18 Drawing Sheets

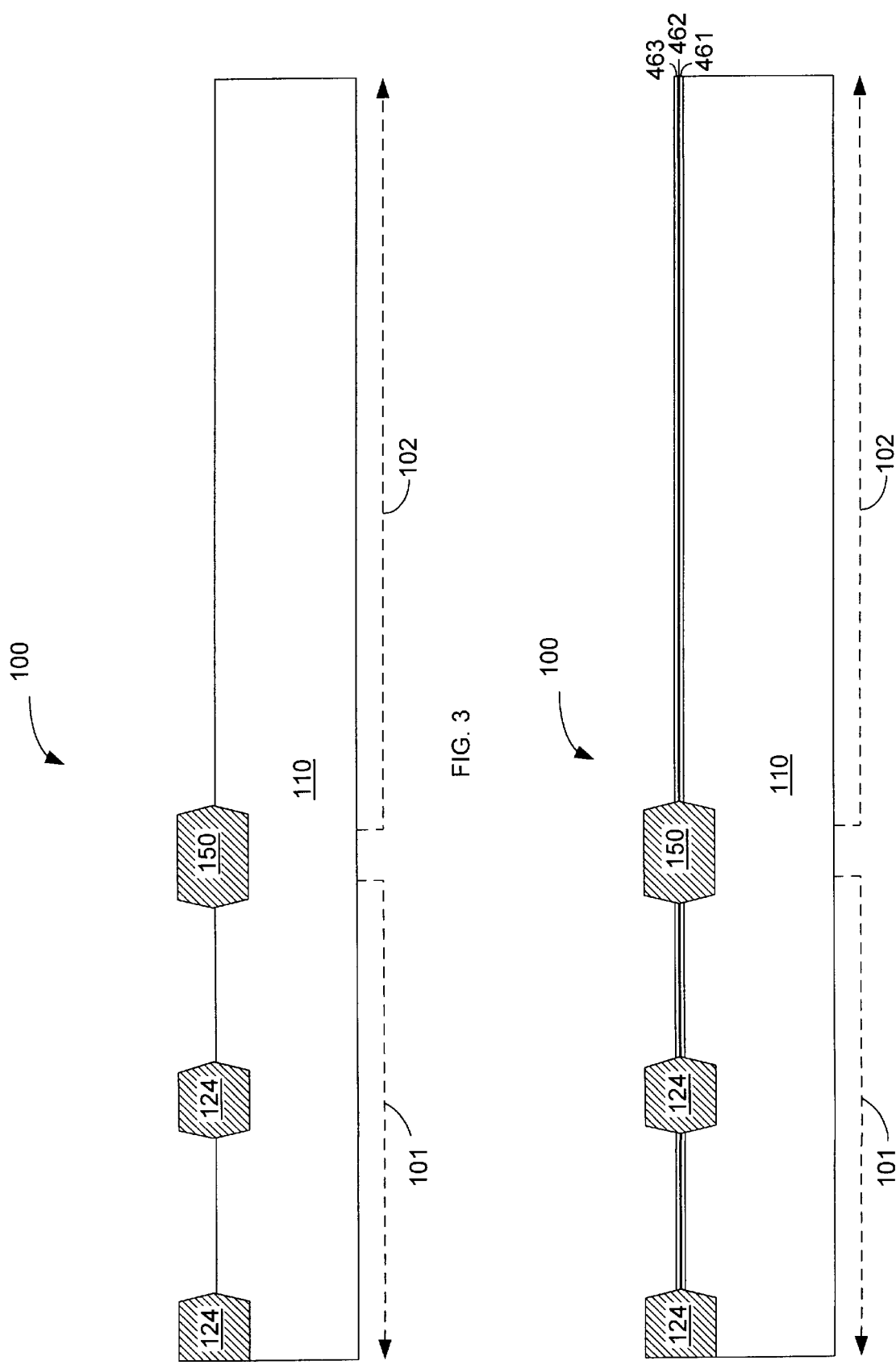

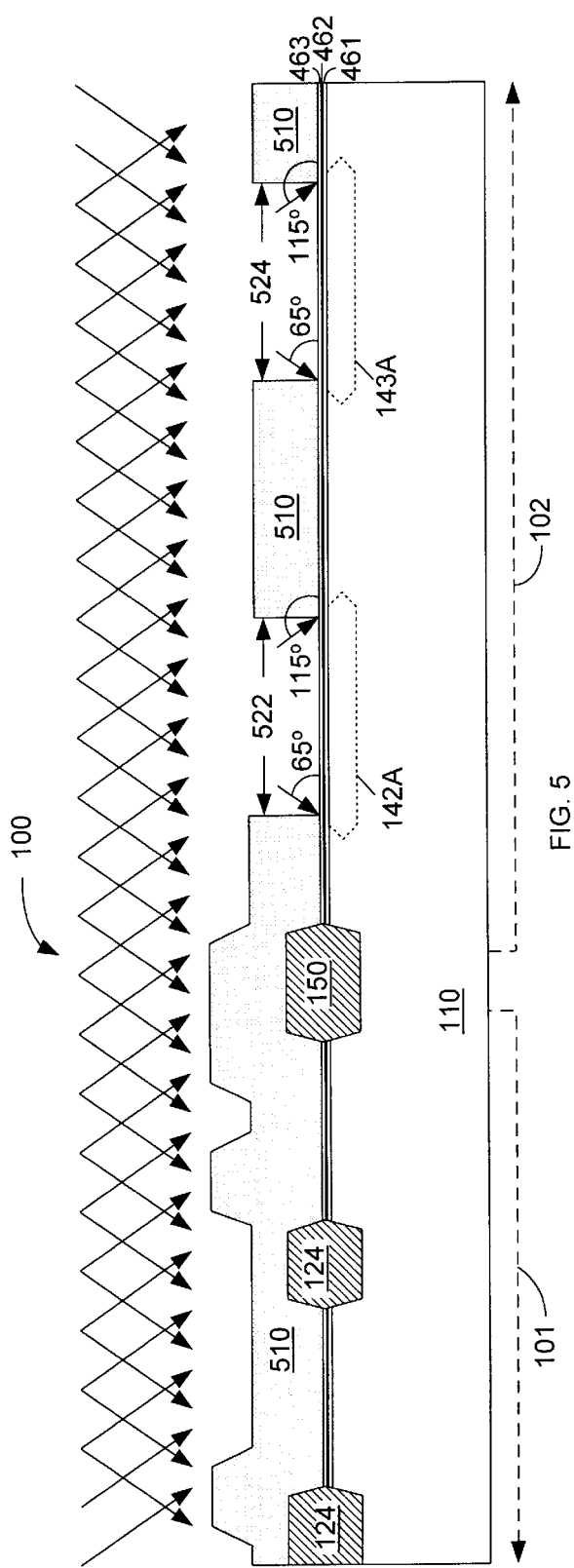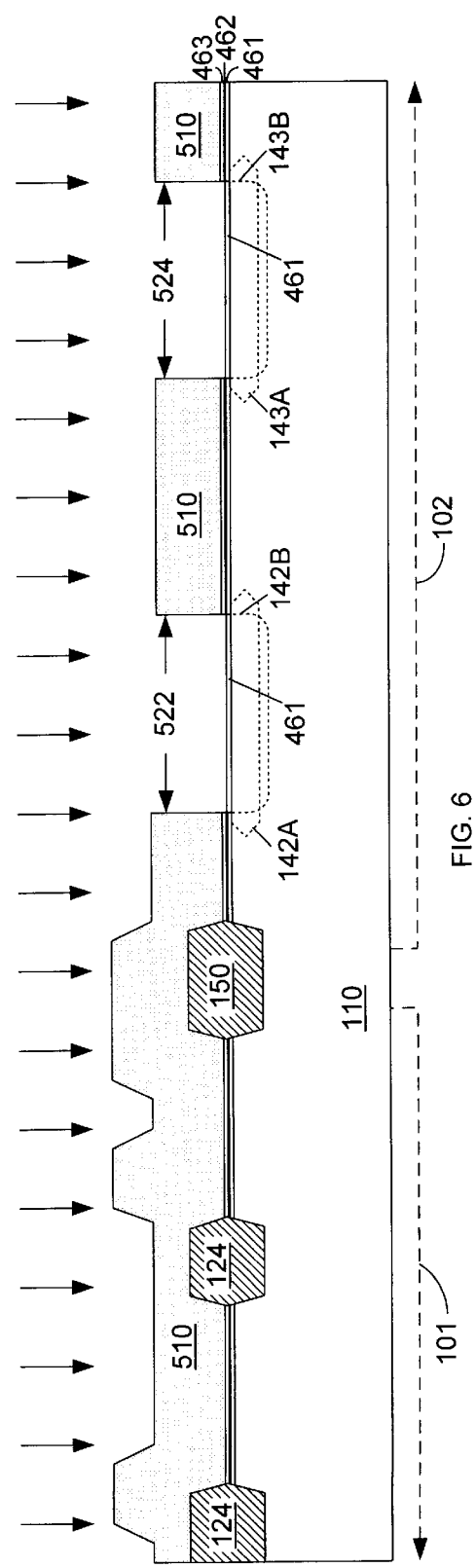

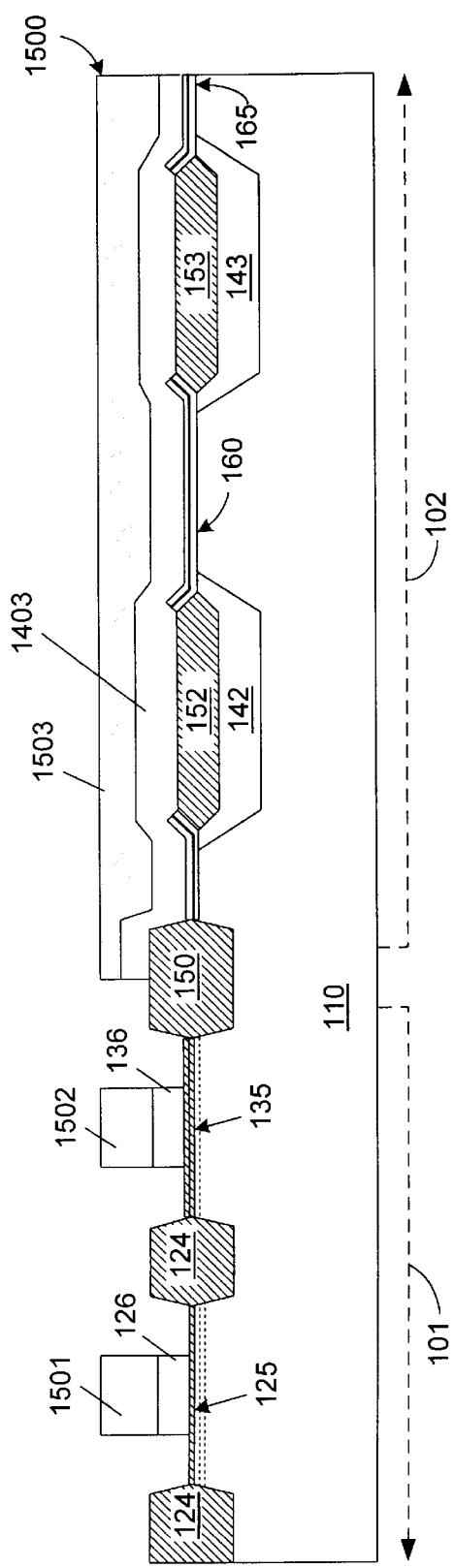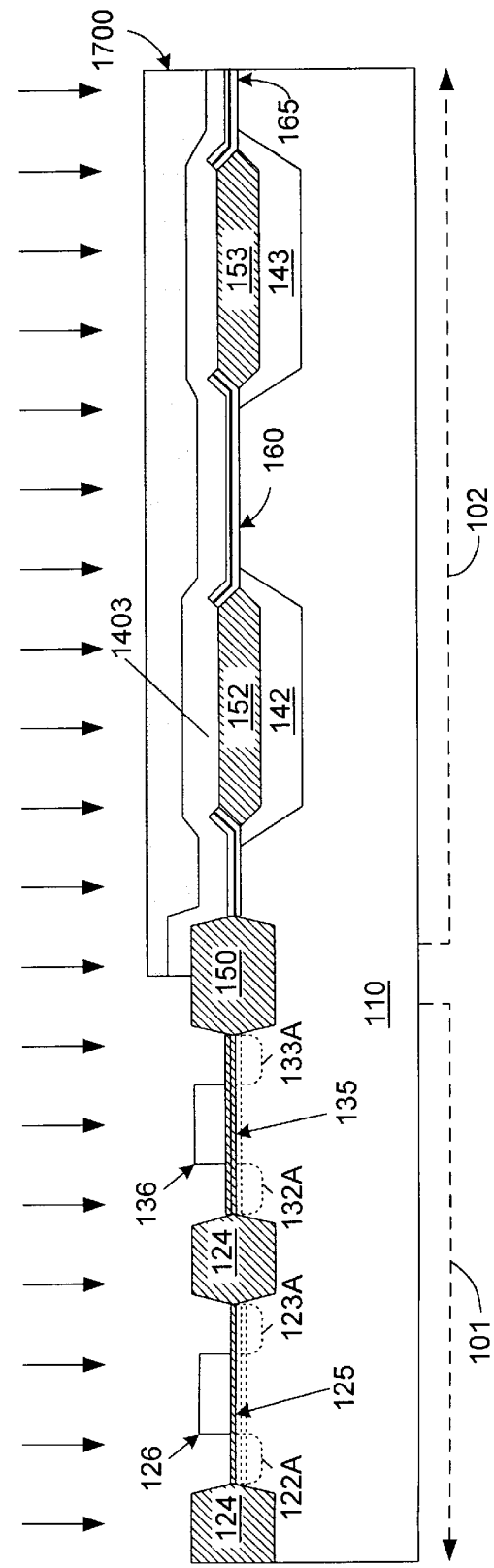

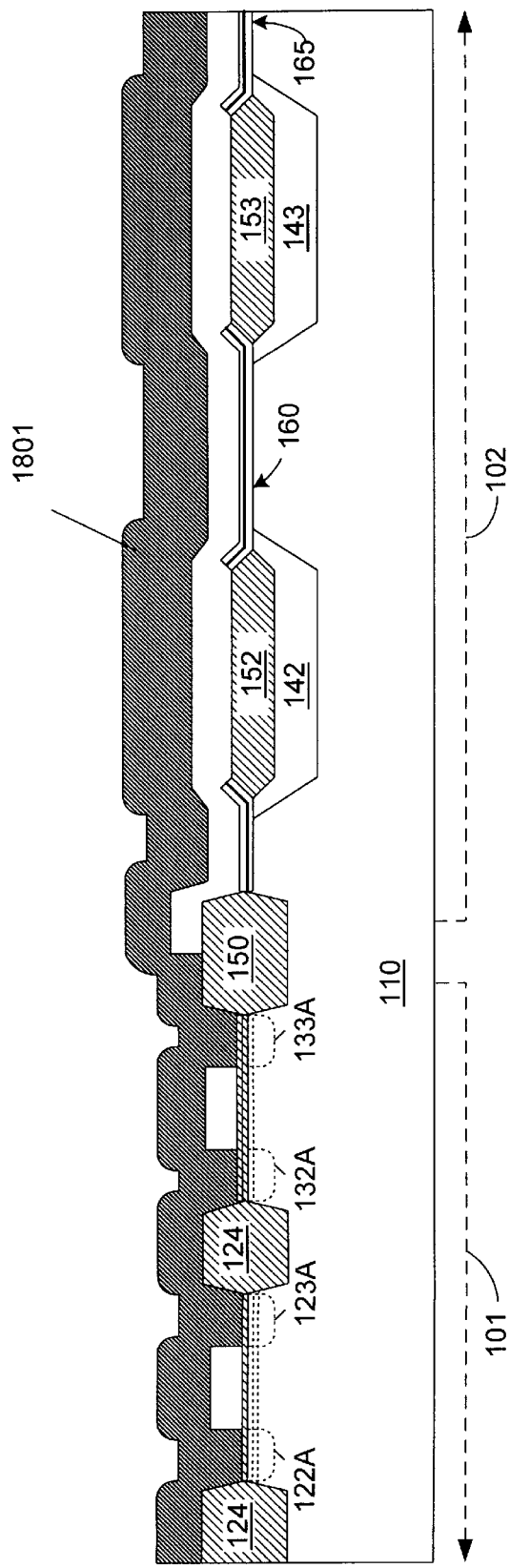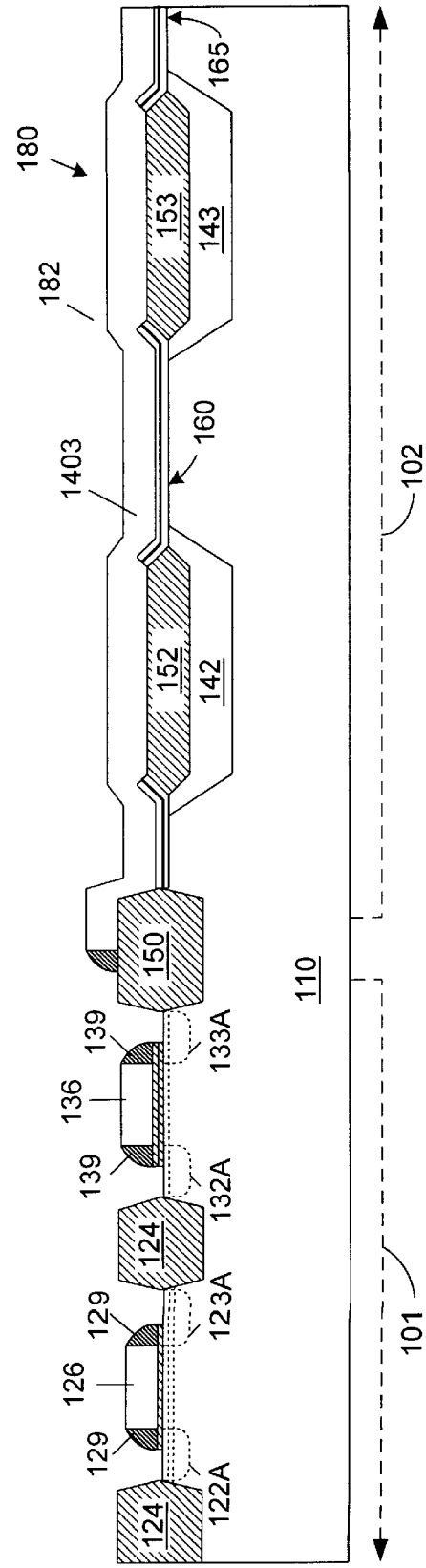

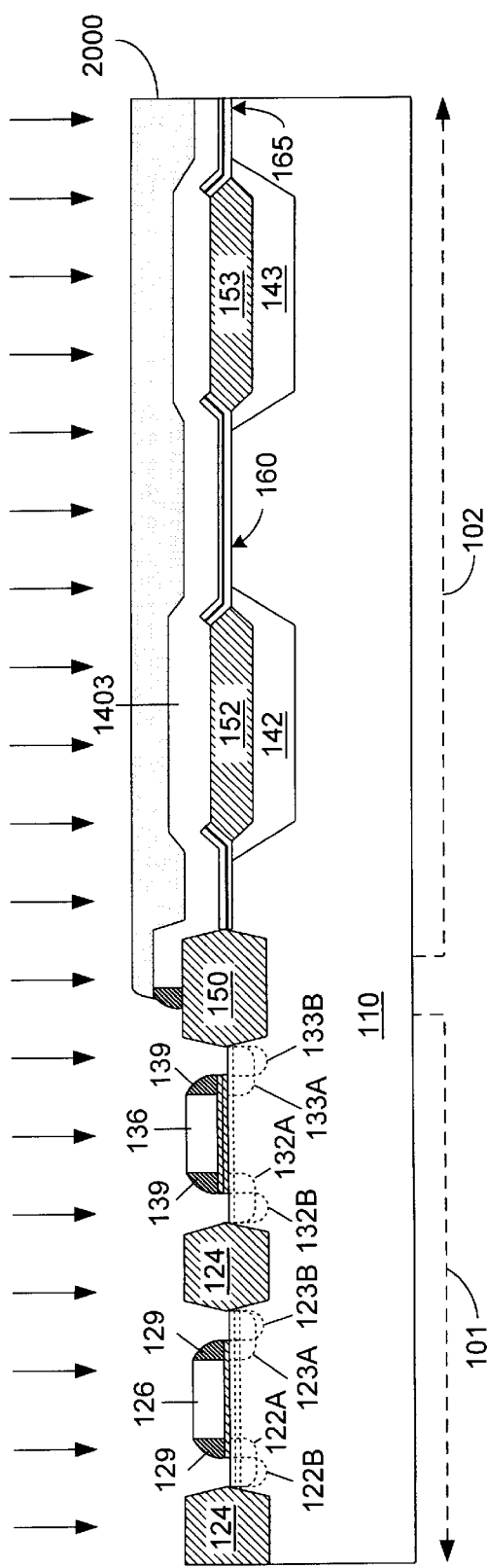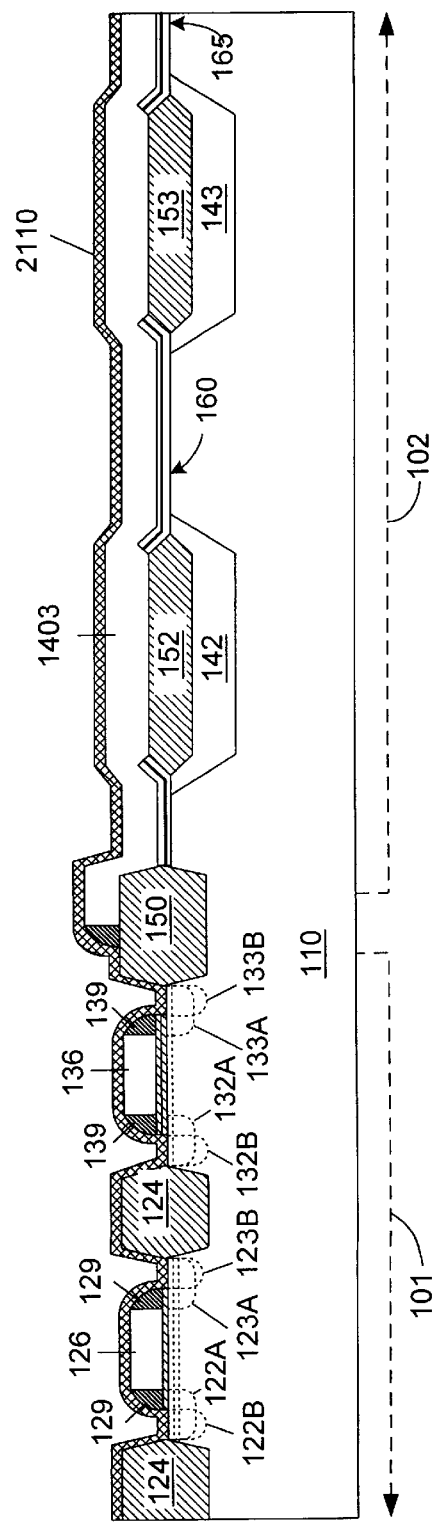
FIG. 20
FIG. 21

SEMICONDUCTOR CHIP HAVING FIELDLESS ARRAY WITH SALICIDE GATES AND METHODS FOR MAKING SAME

FIELD OF THE INVENTION

The present invention relates to the fabrication of a semiconductor device. More specifically, the present invention relates to a method of fabricating a semiconductor device that includes a fieldless array having salicide gate electrodes.

BACKGROUND OF THE INVENTION

In many memory applications, memory transistors and conventional CMOS devices are fabricated on a single semiconductor wafer. Typically, the CMOS devices are fabricated in a first region of the wafer, while the memory transistors are fabricated in a second region of the wafer. On some wafers, the memory transistors are fabricated as part of a fieldless array. A fieldless array is defined as an array that does not use field oxide to isolate the various elements of the array. Because field oxide is not required to isolate the memory transistors in a fieldless array, the memory transistors can be laid out with a relatively high density.

In certain applications, conventional CMOS devices (e.g., transistors) are fabricated in the second region, but do not form part of the fieldless array. That is, the CMOS devices located in the second region are isolated by field oxide. Thus, the second region can include both memory transistors and CMOS devices.

In order to distinguish the above-described transistors, the following nomenclature will be used. As used herein, the term "logic transistor" refers to a transistor fabricated in accordance with conventional CMOS processes, regardless of whether the transistor is fabricated in the first region or the second region of the semiconductor wafer. A CMOS logic transistor is isolated from other elements by field oxide. CMOS logic transistors can further be classified as high voltage CMOS logic transistors and low voltage CMOS logic transistors. High voltage CMOS logic transistors have a thicker gate oxide than low voltage CMOS logic transistors, thereby enabling the high voltage CMOS logic transistors to withstand higher gate voltages. The term "fieldless array transistor" refers to a transistor that does not require field oxide isolation. For example, floating gate type non-volatile memory transistor are often used to form a fieldless array.

The process steps required to fabricate high and low voltage CMOS logic transistors are not fully compatible with the process steps required to fabricate fieldless array transistors. As a result, relatively complex processes would be required to form the high and low voltage CMOS logic transistors and the fieldless array transistors on the same wafer. It would therefore be desirable to have an efficient process for fabricating high and low voltage CMOS logic transistors and fieldless array transistors on the same wafer.

In addition, it may be difficult to achieve an acceptable yield when fabricating both CMOS logic transistors and fieldless array transistors on the same wafer. For example, it is anticipated that methods for fabricating the gate electrodes of the fieldless array transistors may result in electrical short circuits between the source and drain regions of the fieldless array transistors. These short circuits may exist for the following reason. During the formation of the CMOS logic transistors, an etch is performed to create the sidewall spacers of the CMOS logic transistors. This etch can expose the silicon between the source and drain regions of the fieldless array transistors. To reduce the resistance of the gate structures of the transistors, a refractory metal is subsequently deposited over the upper surface of the wafer to form self aligned silicide or "salicide" gate electrodes. A silicide layer is formed by reacting this refractory metal with exposed silicon. Thus, a silicide layer forms between the source and drain regions of the fieldless array transistors thereby causing a short circuit. It would therefore be desirable to have a method for fabricating CMOS logic transistors having self aligned silicide gate structures and fieldless array transistors on the same wafer.

SUMMARY

Accordingly, the present invention provides efficient processes for fabricating CMOS logic transistors having self aligned silicide gate structures and fieldless array transistors on the same wafer. Specifically, in one embodiment of the present invention a semiconductor device comprises at least one logic transistor and a plurality of fieldless array transistors. Both the logic transistor and the fieldless array transistors have gates composed of a polysilicon layer having a metal silicide layer formed thereon. In addition, the logic transistors have drain and source regions having metal silicide active regions formed thereon in a self aligned manner. In one embodiment, the source and drain regions of the fieldless array transistors are buried bit lines with overlying bit line oxide. In this embodiment, the fieldless array transistors can be nonvolatile memory cells having a floating gate structure. The floating gate structures can comprise, for example, a nitride layer sandwiched between two oxide layers.

In accordance with another embodiment of the present invention, the logic transistor is located in a first region of the semiconductor device and the fieldless array transistors are located in a second region of the semiconductor device. A polysilicon layer is formed over the first and second regions of the semiconductor device. The polysilicon layer over the first region of the semiconductor device is etched to define the gates of the logic transistors. However, at this point the polysilicon layer over the second region of the semiconductor device is not etched. Ion implantation over the surface of the semiconductor device creates self-aligned low doped source and drain regions for the logic transistor. Oxide spacers are then formed for the logic transistors. When the oxide spacers are formed in the first region, the entire second region remains covered with polysilicon, thereby preventing undesirable etching in the fieldless array. An implant process implants ions for the highly doped source and drain active regions of the logic transistor. The semiconductor device is then annealed to create the source and drain regions of the logic transistor. An oxide etch is used to remove any oxide on the source and drain regions created during the annealing of the semiconductor device. A refractory metal layer is subsequently deposited over the upper surface of the semiconductor device. The semiconductor device is annealed to cause the portions of the refractory metal layer to react with any silicon in contact with the refractory metal layer to form silicide. At this time, silicide is formed over the source and drain active regions of the logic transistor, the polysilicon gate of the logic transistor, and the polysilicon layer overlying the entire second region. The portions of the refractory metal layer not in contact with silicon are removed using a refractory metal etching process. The polysilicon and silicide overlying the second region of the semiconductor devices are then etched to form the gates of the fieldless array transistors.

The above-described process steps advantageously enable CMOS transistors having self aligned silicide gates structures and fieldless array transistors to be fabricated on the same wafer in an efficient manner. The present invention will be more fully understood in view of the following description and drawings.

BRIEF DESCRIPTION OF THE DRAWINGS

FIGS. 3–15 are cross sectional views illustrating process steps used to fabricate the semiconductor device of FIG. 1 in accordance with one embodiment of the present invention.

FIGS. 16–22 are cross sectional views illustrating process steps used to fabricate the semiconductor device of FIG. 1 in accordance with one embodiment of the present invention.

DETAILED DESCRIPTION

Figure 1:
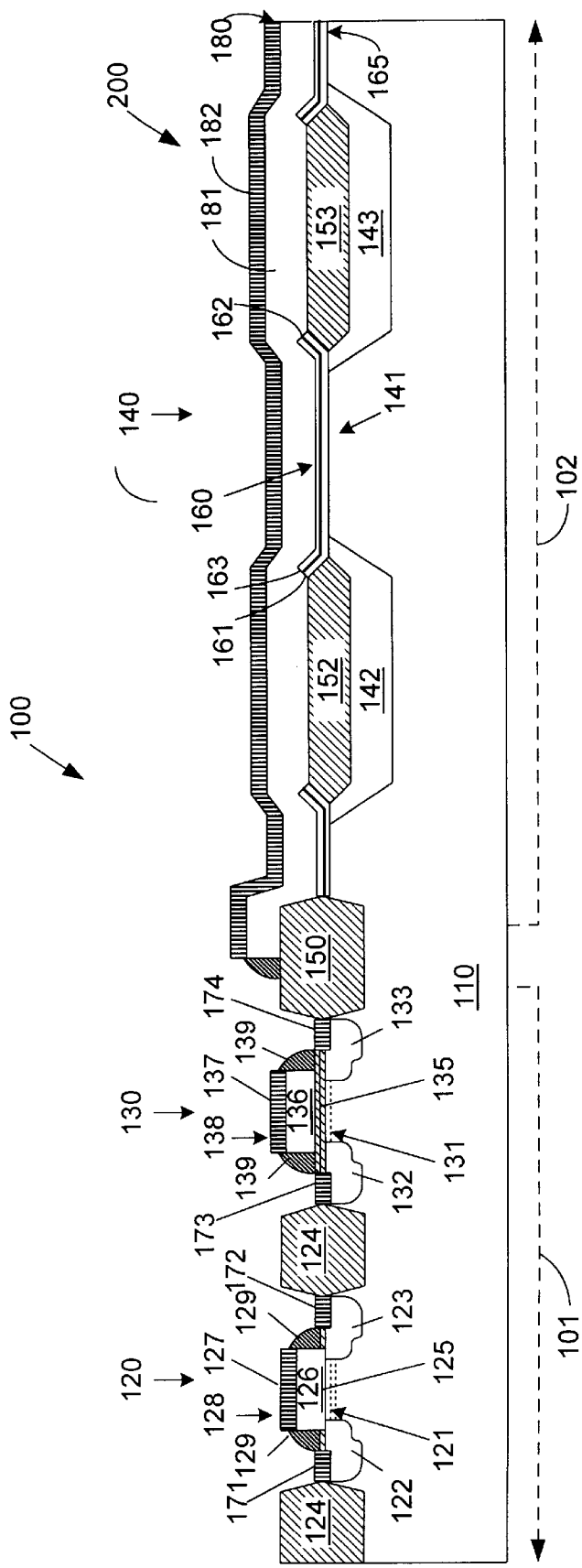
FIG. 1 is a cross sectional view of a semiconductor device that includes a low voltage CMOS logic transistor, a high voltage CMOS logic transistor and a fieldless array transistor in accordance with one embodiment of the present invention.

FIG. 1 is a cross sectional view of a semiconductor device 100 that is fabricated in accordance with one embodiment of the present invention. Semiconductor device 100 is divided into a first region 101 and a second region 102. First region 101 and second region 102 are separated by border field oxide 150. Conventional CMOS devices are fabricated in first region 101, while a fieldless array of transistors 200 is fabricated in second region 102. In addition to the fieldless array, CMOS devices (not shown) are also fabricated in second region 102. The various elements of semiconductor device 100 are not shown to scale.

Semiconductor device 100 includes n-channel field effect transistors 120 and 130 fabricated in the first region 101 of semiconductor substrate 110. In the described embodiment, transistor 120 is a conventional low voltage CMOS logic transistor, and transistor 130 is a conventional high voltage CMOS logic transistor. As used herein, high voltage transistors have thicker gate oxides than low voltage transistors and thus can accommodate higher gate voltages as compared to low voltage transistors. It is understood that first region 101 will typically include many other CMOS devices.

Semiconductor device 100 also includes a floating gate type n-channel field effect transistor 140 fabricated in second region 102 of semiconductor substrate 110. In the described embodiment, transistor 140 is a fieldless array transistor which is used as a non-volatile memory cell.

Low voltage logic transistor 120 includes N+ type source and drain regions 122 and 123, P-type channel region 121, gate oxide layer 125, conductively doped salicided polycrystalline silicon (polysilicon) gate 126, electrically insulating sidewall spacers 129, and metal salicide layers 127, 171 and 172. Together, polysilicon gate 126 and metal salicide layer 127 form a salicide control gate 128 for logic transistor 120. Metal salicide layers 171 and 172 provide low resistive contacts to source and drain regions 122 and 123, respectively.

High voltage logic transistor 130 includes N+ type source and drain regions 132 and 133, P-type channel region 131, gate oxide layer 135, conductively doped salicided polycrystalline silicon (polysilicon) gate 136, electrically insulating sidewall spacers 139, and metal salicide layers 137, 173, and 174. Together, polysilicon gate 136 and metal salicide layer 137 form a salicide control gate 138 for logic transistor 130. Metal salicide layers 173 and 174 provide low resistive contacts to source and drain regions 132 and 133, respectively.

Fieldless array transistor 140 includes a P-type channel region 141 and N+ type diffusion bit lines 142 and 143, which act as the source and drain regions of fieldless array transistor 140. Bit line oxide regions 152 and 153 are located over buried diffusion bit lines 142 and 143, respectively. Portions of buried diffusion bit lines 142 and 143 extend laterally beyond the edges of bit line oxide regions 152 and 153. Fieldless array transistor 140 also includes a floating gate structure 160 formed from a first dielectric layer 161, a floating gate layer 162, and a second dielectric layer 163. In accordance with one embodiment of the present invention, first dielectric layer 161 is a silicon oxide layer, floating gate layer 162 is a silicon nitride layer, and second dielectric layer 163 is a silicon oxide layer. For this embodiment, floating gate structure 160 is sometimes referred to as an ONO structure because of the oxide-nitride-oxide layering of the structure. Floating gate layer 162 could also be formed using a conductive material such as doped polysilicon. A conductively doped polysilicon layer 181 overlies bit line oxide regions 152–153 and floating gate structure 160. A metal salicide layer 182 overlies polysilicon layer 181. Metal salicide layer 182 and polysilicon layer 181 collectively form salicide control gate 180 of fieldless array transistor 140. Bit line oxide regions 152 and 153 isolate buried diffusion bit lines 142 and 143 from polycide control gate 180.

In the described embodiment, fieldless array transistor 140 is connected to a plurality of other fieldless array transistors to form a fieldless array. The fieldless array transistors share control gates and diffusion bit lines in a manner which is described below.

Figure 2:
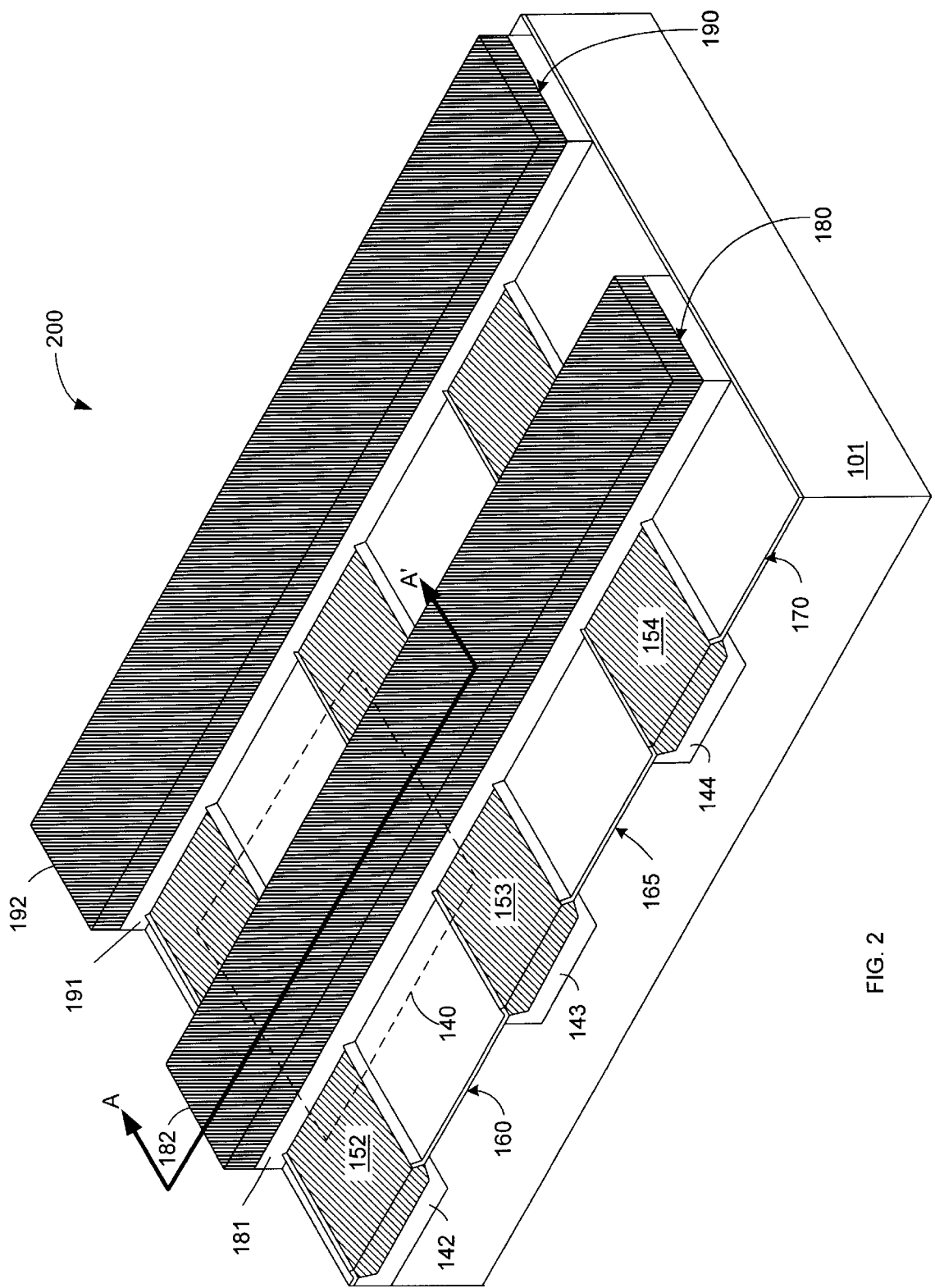
FIG. 2 is an isometric view of a portion of a fieldless array in accordance with one embodiment of the present invention.
Figure 7:
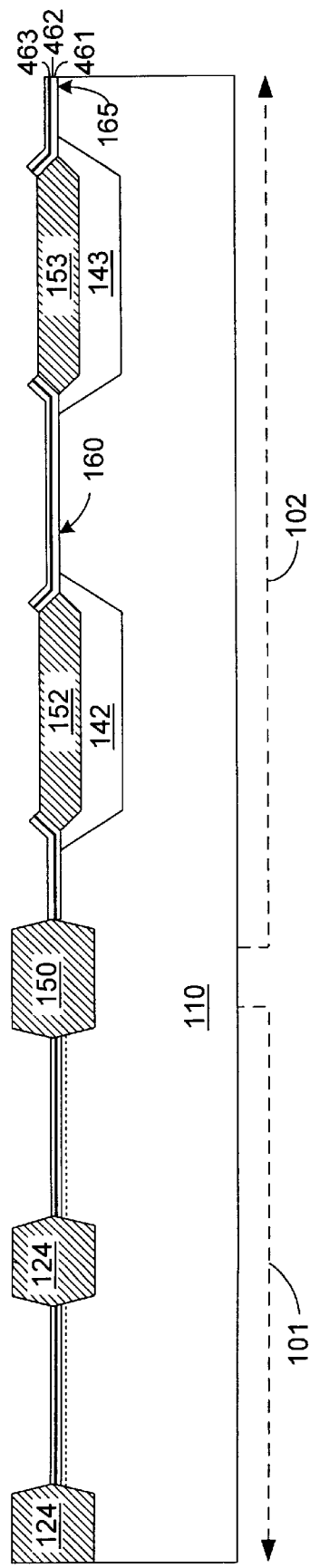

FIG. 2 is an isometric view of a portion of the fieldless array 200 that is fabricated in second region 102. Fieldless array transistor 140 is identified by dashed lines in FIG. 2. The cross sectional view of fieldless array 200 illustrated in FIG. 1 is taken along section line A–A' of FIG. 2.

Fieldless array 200 includes a plurality of diffusion bit lines 142, 143, 144 that extend in parallel along a first axis. Each of buried bit lines 142, 143, 144 is covered by a corresponding bit line oxide layer 152, 153, 154. Floating gate structures 160, 165, and 170 extend in parallel along the first axis, between adjacent diffusion bit lines. For example, floating gate structure 160 is located between diffusion bit lines 142 and 143, with the ends of floating gate structure 160 extending over the edges of diffusion bit lines 142–143 and the edges of bit line oxide layers 152–153. Salicide control gate electrodes 180 and 190 extend in parallel along a second axis that is perpendicular to the first axis. Salicide control gate 180 was described above. Salicide control electrode 190 includes conductively doped polysilicon layer 191 and metal salicide layer 190.

As explained above, diffusion bit lines 142 and 143 form the source and drain, respectively, of fieldless array transistor 140. However, diffusion bit lines 142 and 143 also form the source and drain, respectively, of an adjacent transistor that includes polycide control gate 190 and floating gate structure 160. Thus, the sources and drains of the fieldless array transistors extend laterally beyond the gates of these transistors. Furthermore, diffusion bit line 143 also forms the source in another adjacent transistor which includes salicide control gate 180, floating gate structure 165 and diffusion bit line 144 (which forms the drain of this adjacent transistor). The operation of fieldless array 200 is described in more detail in commonly owned co-pending U.S. patent application Ser. No. 09/244,529, filed Feb. 4, 1999, by Yoav Lavi and Ishai Nachumovsky, entitled "EEPROM ARRAY USING 2-BIT NON-VOLATILE MEMORY CELLS AND METHOD OF IMPLEMENTING SAME"; commonly owned co-pending U.S. patent application Ser. No. 09/244,317, filed Feb. 4, 1999, by Ishai Nachumovsky, entitled "EEPROM ARRAY USING 2-BIT NON-VOLATILE MEMORY CELLS WITH SERIAL READ OPERATIONS"; and commonly owned co-pending U.S. patent application Ser. No. 09/243,976, filed Feb. 4, 1999, by Oleg Dadashev, entitled, "BIT LINE CONTROL CIRCUIT FOR A MEMORY ARRAY USING 2-BIT NON-VOLATILE MEMORY CELLS".

FIGS. 3–25 illustrate process steps used to form semiconductor device 100 in accordance with one embodiment of the present invention. The described process is a twin-well process. Initially the array p-well is formed within substrate 102. Boron species are implanted and activated during a high temperature drive-in anneal. It is understood that the fieldless array is fabricated in a p-well, and that n-channel CMOS logic transistors 120 and 130 are fabricated in a p-well. (P-channel devices are fabricated in the n-wells.)

As illustrated in FIG. 3, the required field oxide is then formed. The illustrated field oxide includes border field oxide 150 and CMOS field oxide regions 124. The field oxide is thermally grown in accordance with conventional CMOS processing techniques (e.g., locos) to a thickness in the range of about 3000 to 8000 Å, or more particularly, in the range of about 5000 to 7500 Å. In the described embodiment, the field oxide is grown to a thickness of about 6000 Å. It is noted that in conventional CMOS processes, a sacrificial oxide is grown after the field oxide is grown and low voltage n-well and p-well implants are typically performed through the sacrificial oxide.

Turning now to FIG. 4, after the field oxide has been grown, a dielectric layer 461 is deposited or created on the surface of semiconductor device 100. A floating gate layer 462 is then deposited on the upper surface of dielectric layer 461. Then, a dielectric layer 463 is either deposited or created on floating gate layer 462. Dielectric layer 461 is a layer of silicon oxide having a thickness in the range of about 40 to 200 angstroms. Floating gate layer 462 is formed by depositing a layer of silicon nitride having a thickness in the range of 80 to 200 angstroms. In the described embodiment, floating gate layer 462 has a thickness of approximately 135 angstroms over dielectric layer 461. The upper surface of floating gate layer 462 is thermally oxidized, thereby creating a silicon oxide layer as dielectric layer 463. For clarity, dielectric layer 461 is referred to as silicon oxide layer 461, floating gate layer 462 is referred to as silicon nitride layer 462, and dielectric layer 463 is referred to as silicon oxide layer 463 is describing the embodiment of FIGS. 3–25. Silicon nitride layer 462 is a very stable layer and requires a high temperature in the presence of hydrogen and oxygen to create silicon oxide at a reasonable rate. In the described embodiment, the high temperature is about 1000° C. The silicon oxide layer promotes charge retention in silicon nitride layer 462 during operation. Oxidization of silicon nitride layer 462 reduces the thickness of silicon nitride layer 462 to approximately 30 to 150 angstroms, while creating silicon oxide layer 463 having a thickness in the range of 30 to 150 angstroms. In the described embodiment, the thickness of silicon nitride layer 462 is reduced to about 75 angstroms, and silicon oxide layer 463 has a thickness of approximately 100 angstroms. In the described embodiment, the combined thickness of layers 461–463 is in the range of about 200–250 angstroms. The combined thickness of these layers 461–463 is therefore negligible compared to the thickness of field oxide 124 and 150. Therefore, FIGS. 4–21 do not show layers 461–463 over field oxide 124 and 150, even though these layers are present.

In an alternative embodiment, silicon nitride layer 462 is not oxidized to form silicon oxide layer 463. Instead, silicon oxide layer 463 is deposited over silicon nitride layer 462. In this embodiment, silicon nitride layer 462 has a thickness in the range of 40 to 200 angstroms, and silicon oxide layer 463 has a thickness in the range of 50 to 150 angstroms. In a particular embodiment, silicon nitride layer 462 has a thickness of about 100 angstroms, and silicon oxide layer 463 has a thickness of about 100 angstroms. After formation of silicon oxide layer 463, low voltage and high voltage n-well and p-well areas are formed in first region 101 using four separate photolithography and ion implantation steps. Specifically, boron is implanted in low voltage and high voltage p-well areas. Conversely, phosphorus is implanted in low voltage and high voltage n-well areas. Implantation of the boron and phosphorous is performed through silicon oxide layer 463, silicon nitride layer 462, and silicon oxide layer 461. To avoid confusion, the various n-wells and p-well areas are not shown in the Figures.

A layer of photoresist is then deposited over the upper surface of semiconductor device 100. This photoresist layer is exposed and developed to create a photoresist mask 510 having openings 522 and 524, as illustrated in FIG. 5. Openings 522 and 524 are located to define the diffusion bit lines of fieldless array 200. More specifically, openings 522 and 524 define the locations of diffusion bit lines 142 and 143, respectively. High angle implants are then performed through openings 522 and 524. More specifically, a P-type impurity, such as boron, is implanted through upper silicon oxide layer 463, silicon nitride layer 462, and lower silicon oxide layer 461 through openings 522 and 524 of photoresist mask 510 at acute and obtuse angles with respect to the surface of semiconductor substrate 110, such that the dopant extends under the edges of photoresist mask 510. The implanted boron serves to adjust the threshold voltages of the fieldless array transistors. The implanted p-type impurities are illustrated as 142A and 143A in FIG. 5.

After performing the high angle implants, the portions of silicon oxide layer 463 and silicon nitride layer 462 that are exposed by openings 522 and 524 are removed. An N-type impurity, such as arsenic, is then implanted through openings 522 and 524 of photoresist mask 510. The implanted N-type impurities are illustrated as 142B and 143B in FIG. 6.

Photoresist mask 510 is then stripped, and a thermal oxidation step is performed, thereby creating bit line oxide regions 152 and 153. (FIG. 7) The growth of bit line oxide regions 152 and 153 causes the portions of silicon nitride layer 462 and silicon oxide layer 463 which are adjacent to bit line oxide regions 152 and 153 to bend upward, thus forming floating gate structures 160 and 165. This oxidation step also activates and diffuses the implanted impurities in regions 142A–142B and 143A–143B, thereby forming diffusion bit lines 142 and 143. Note that diffusion bit lines 142 and 143 diffuse under the floating gate structures 160 and 165 as illustrated. (Subsequent high temperature processing steps complete the activation of the implanted impurities in regions 142A–142B and 143A–143B).

Figure 8:
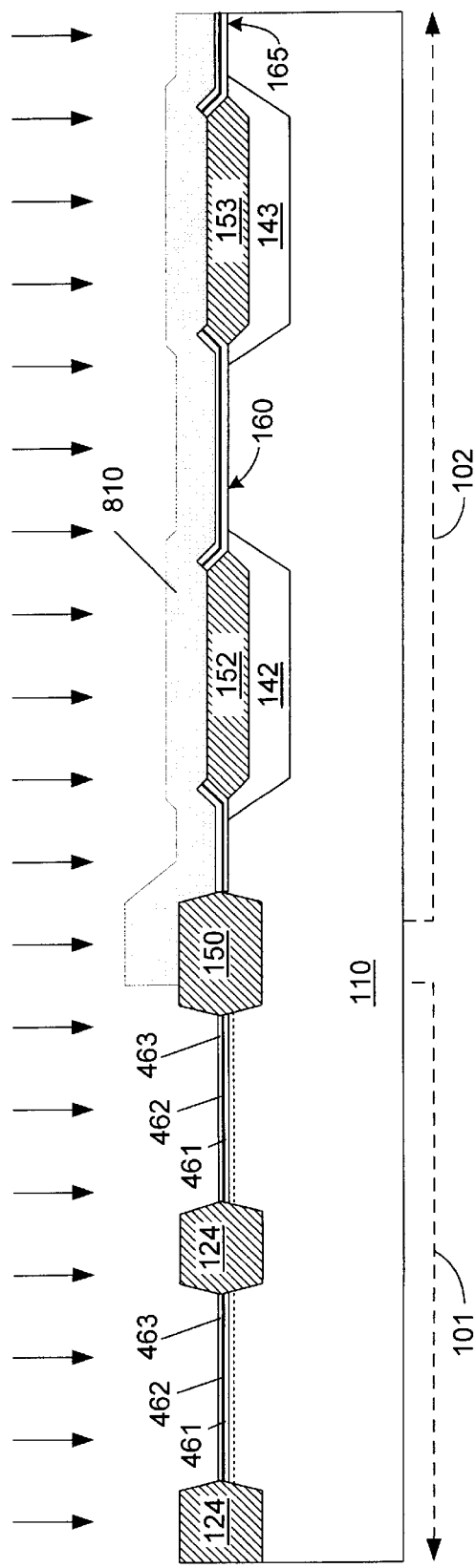
Figure 9:
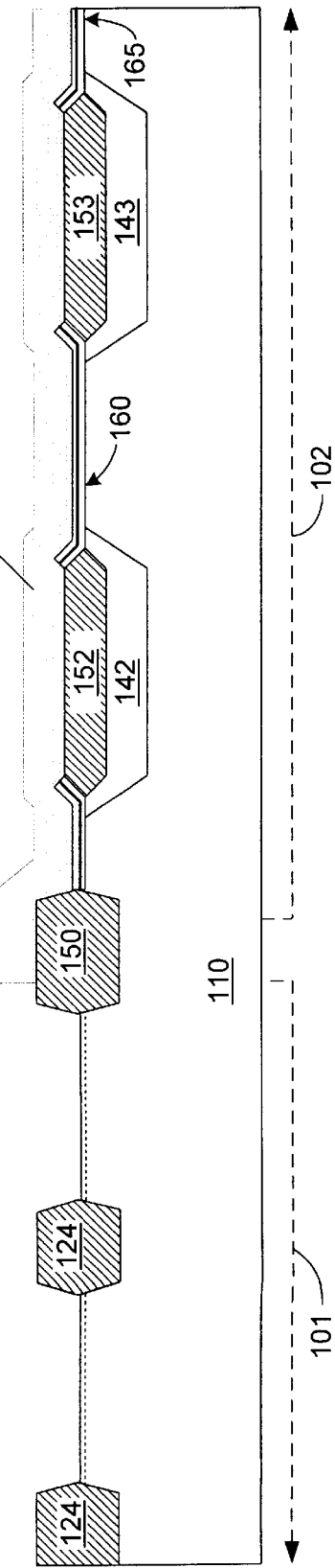

Another layer of photoresist material is then deposited over the upper surface of the resulting structure. This photoresist layer is exposed and developed to form photoresist mask 810. (FIG. 8) As illustrated in FIG. 8, photoresist mask 810 exposes first region 101 and covers second region 102. It is noted that specific zones in second region 102 might also be exposed at this time, thereby allowing logic transistors to be fabricated in second region 102 in the manner suggested above. An implant to adjust the threshold voltages of the high voltage CMOS logic transistors is then performed. In the described embodiment, this high voltage threshold implant is performed by implanting a P-type impurity, such as boron, to adjust the threshold voltage of the high voltage transistors. In accordance with one embodiment of the present invention, the P-type impurities are implanted with a dopant density in the range of 5e11 to 1e13 ions/cm$^2$ and an implantation energy in the range of 20 to 50 KeV. In another embodiment, the P-type impurities are implanted with a dopant density in the range of 5e11 to 6e12 ions/cm$^2$ and an implantation energy in the range of 20 to 40 KeV. In the described embodiment, the p-type impurities are implanted with a dopant density of 2.15e12 ions/cm$^2$ and with an implantation energy of 30 KeV. The high voltage threshold implant is illustrated by a single dashed line in substrate 110.

A series of etches are then performed to remove the exposed portions of upper silicon oxide layer 463, silicon nitride layer 462, and lower silicon oxide layer 461. In one embodiment of the present invention, upper silicon oxide layer 463 is first removed with a wet etch. Silicon nitride layer 462 is then removed with a dry etch that is performed, for example, by an RIE polynitride etcher.

Figure 10:
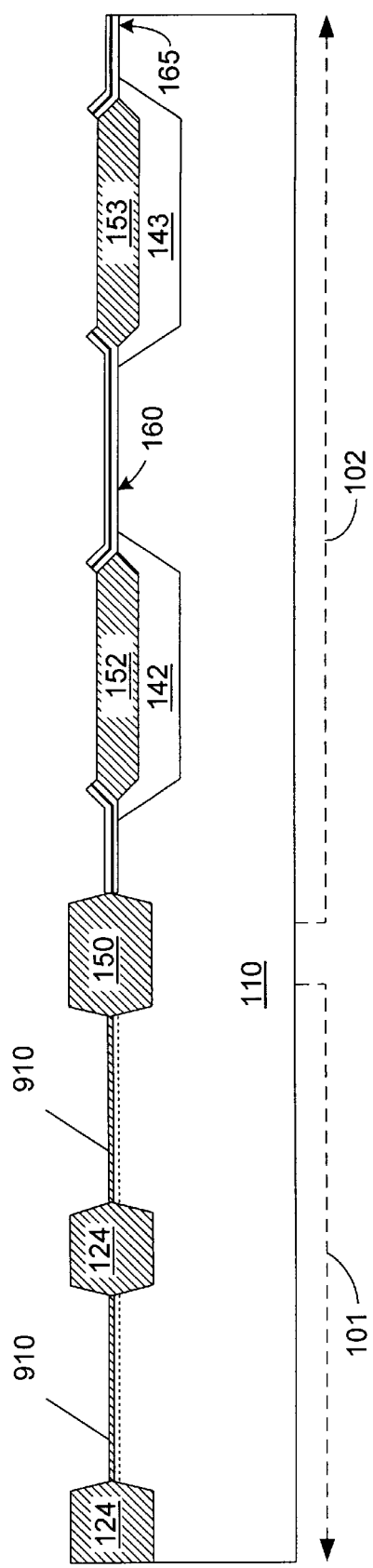
Figure 11:
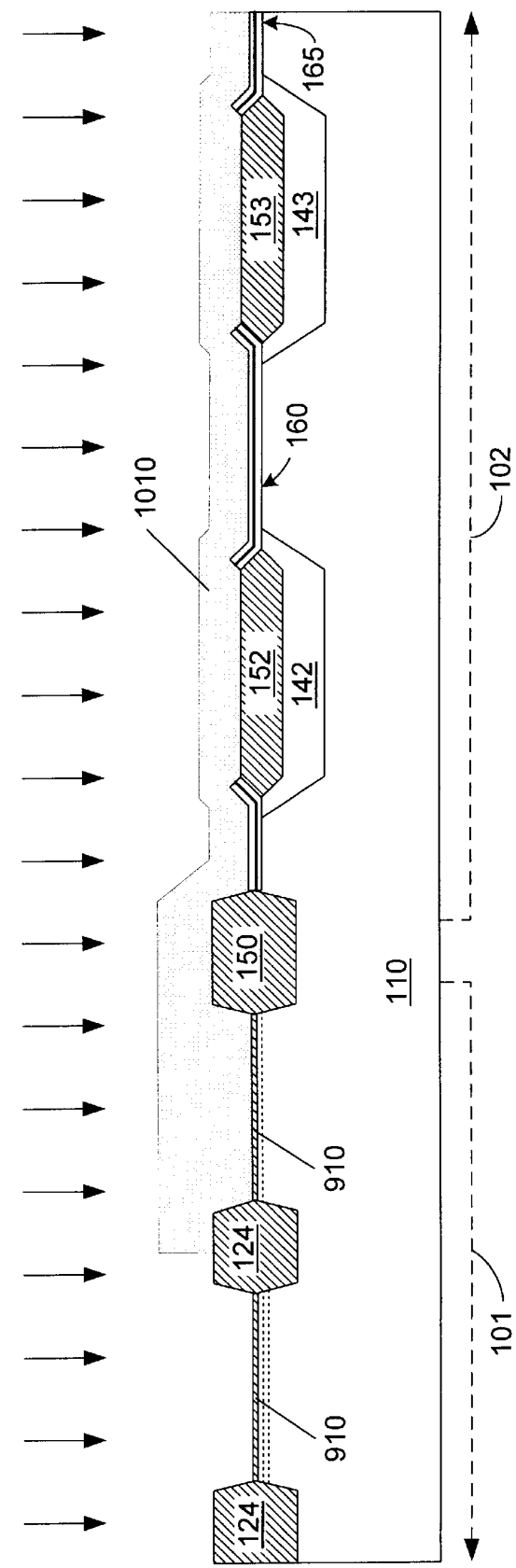

As shown in FIG. 10, photoresist mask 810 is stripped and the surface of the resulting structure is thermally oxidized to form a gate oxide layer 910. Additional oxide is also formed on field oxide 124, border field oxide 150, bit line oxide 152, and bit line oxide 153. However, silicon nitride layer 462 of floating gate structures 160 and 165 is generally self-retarding and prevents additional oxide from forming on the portions of silicon oxide layer 463 located over silicon nitride layer 462. This is because of the high energy required to form oxide over nitride layer 462. In one embodiment, a dry oxidization process is performed at 800°–900° C. to create gate oxide layer 910 having a thickness in the range of about 80 to 150 angstroms. Note that there is no requirement of forming and stripping a sacrificial oxide layer prior to forming gate oxide layer 910. The thickness of silicon nitride layer 462 is sufficient to protect the underlying substrate 110 from contamination which could otherwise result in the required use of a sacrificial oxide layer. Experimental results suggest that silicon nitride layer 462 should have a thickness of at least 100–200 angstroms to eliminate the requirement of a sacrificial oxide layer.

Figure 12:
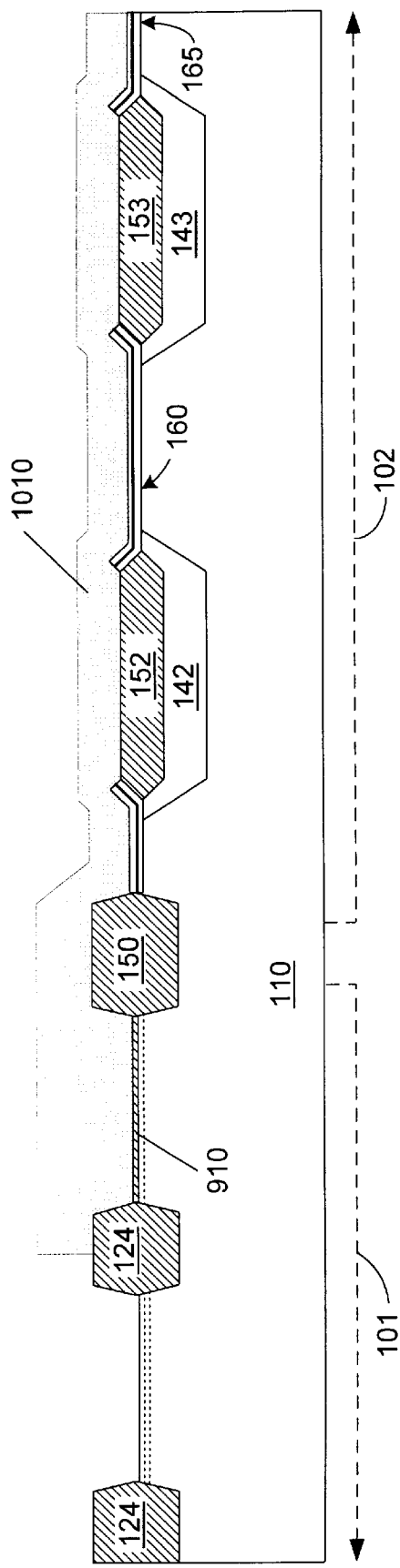
Figure 13:
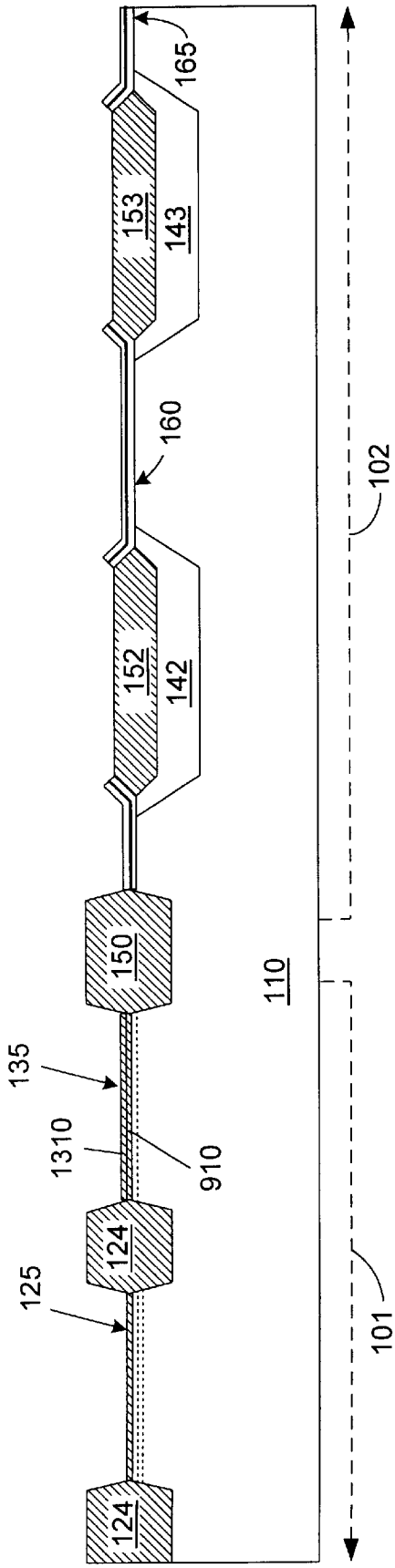

A layer of photoresist is deposited over the surface of the resulting structure. This photoresist layer is exposed and developed to create photoresist mask 1010. Photoresist mask 1010 covers the semiconductor structure, except for the regions where low voltage logic transistors will be formed. Photoresist mask 1010 therefore exposes the region where low voltage transistor 120 is to be formed. As shown in FIG. 12, the portion of gate oxide layer 910 that is exposed by photoresist mask 1010 is stripped by an oxide etch. In the described embodiment, the gate oxide etch is performed using 50:1 diluted HF at 24° C. for 120 seconds. Photoresist mask 1010 is then stripped, and the surface of the resulting structure is thermally oxidized. (FIG. 13) In one embodiment, the thermal oxidation step is a dry oxidization process performed at 900° C. The thermal oxidation step results in the growth of a gate oxide layer 125 in the region where low voltage logic transistor 120 is to be formed. Gate oxide layer 125 is grown to a thickness in the range of 80 to 150 angstroms. In the described embodiment, gate oxide layer 125 is grown to a thickness of about 70 angstroms. The thermal oxidation step also results in the thickening of gate oxide layer 910 in the region where high voltage logic transistor 130 is to be formed. This thickening is illustrated as an additional oxide layer 1310. Oxide layers 910 and 1310 combine to form gate oxide layer 135. In the described embodiment, gate oxide layer 135 has a thickness of about 200 angstroms. Additional oxide is also formed on field oxide 124, border field oxide 150 and bit line oxide layers 152–153. Bit line oxide layers 152–153, which had an initial thickness of about 600 Å, grow to a thickness in the range of about 1000 to 2000 angstroms, or 1000 to 1500 angstroms during the entire processing of the wafer. In the described embodiment, bit line oxide layers 152–153 grow to a thickness of about 1200 Å during the processing of the wafer. Silicon nitride layer 462 of floating gate structures 160 and 165 are generally self-retarding and prevent additional oxide from forming on portions of silicon oxide layer 463 located over silicon nitride layer 462.

Figure 14:
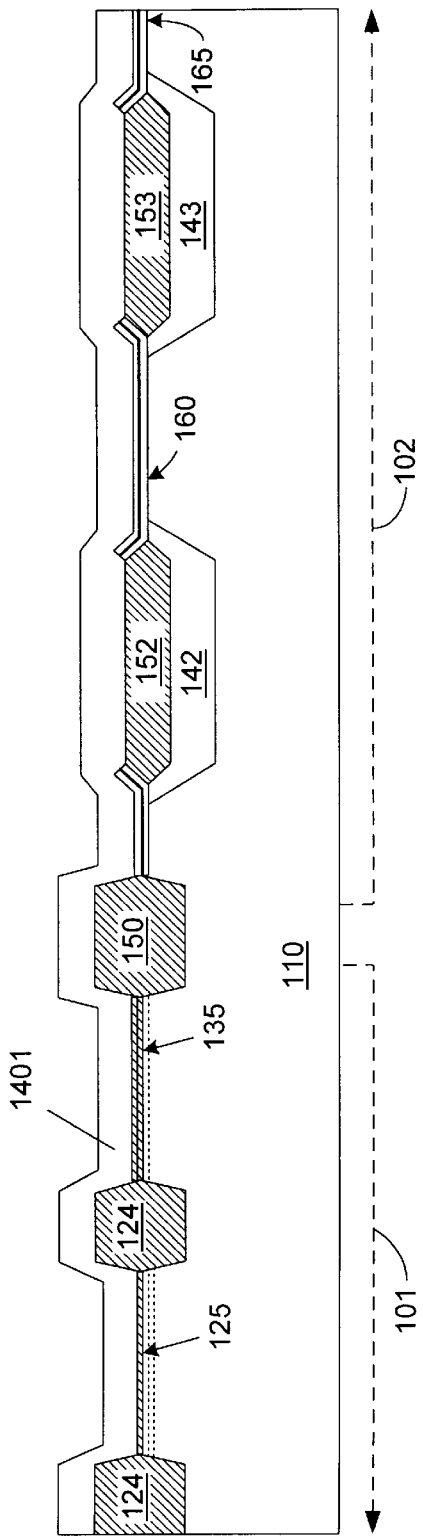

As illustrated in FIG. 14, a blanket layer of polysilicon 1401 is then deposited over the upper surface of the resulting structure. In some embodiments, impurities, such as phosphorus, are implanted into polysilicon layer 1401 to increase the conductivity of polysilicon layer 1401. After implantation, an anneal step may be performed. In the described embodiment, polysilicon layer 1401 has a thickness of 2000–3000 angstroms and is implanted with phosphorus ions (P+) to a dopant density of 1e14 to 5e14 ions/cm$^2$ at an implant energy of 40–50 KeV. After implantation, an anneal step is performed at 850° C.

Figure 15:
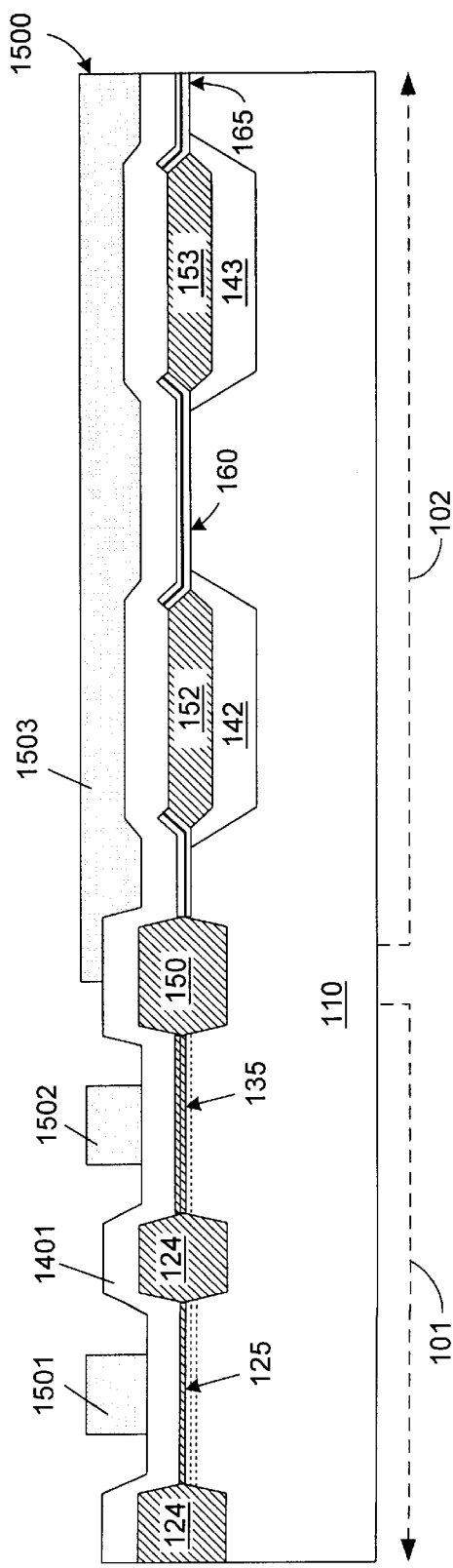
Figure 15A:
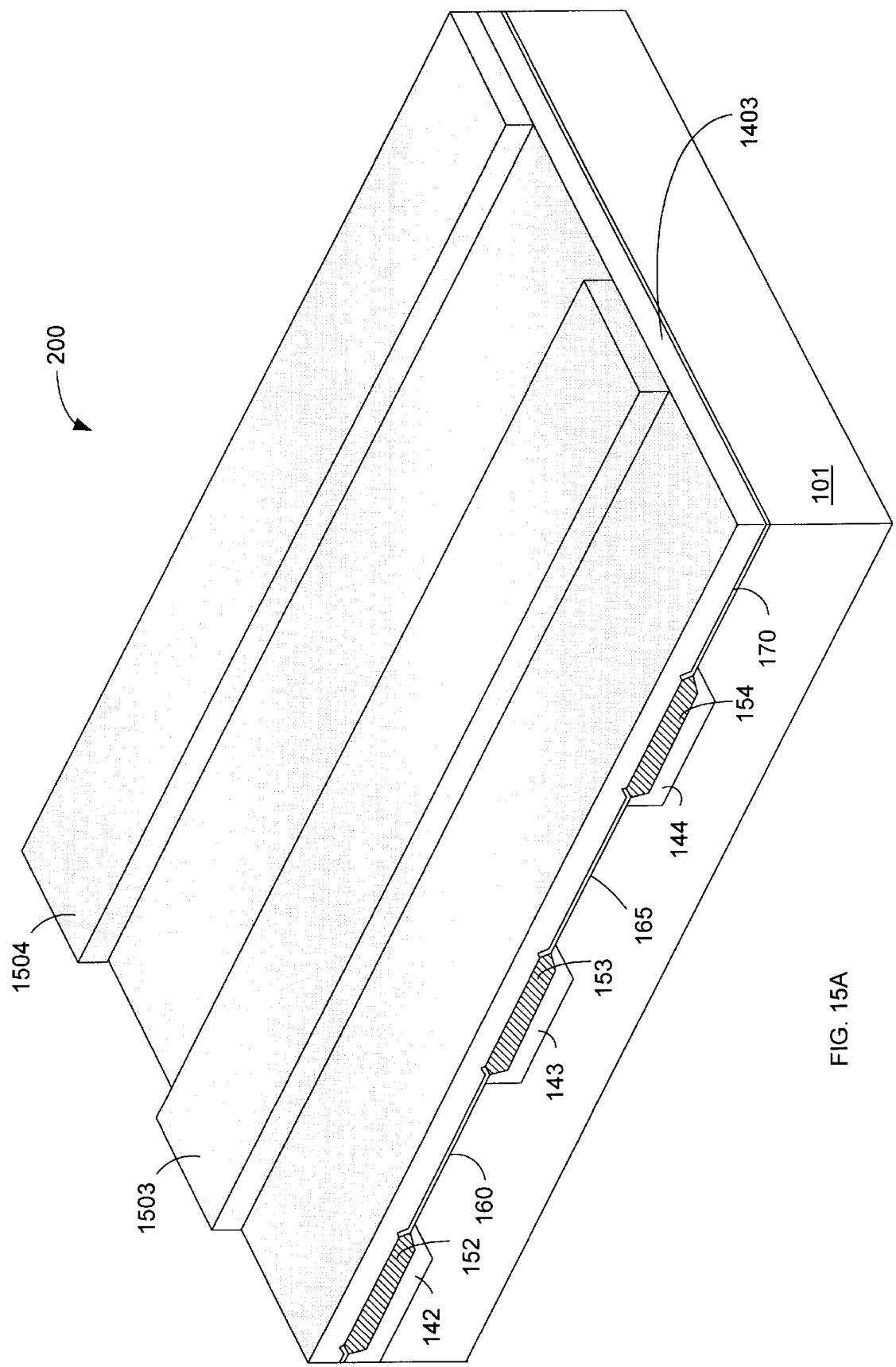
FIG. 15A is an isometric view illustrating how a conventional salicide step would process a fieldless array.
Figure 15B:
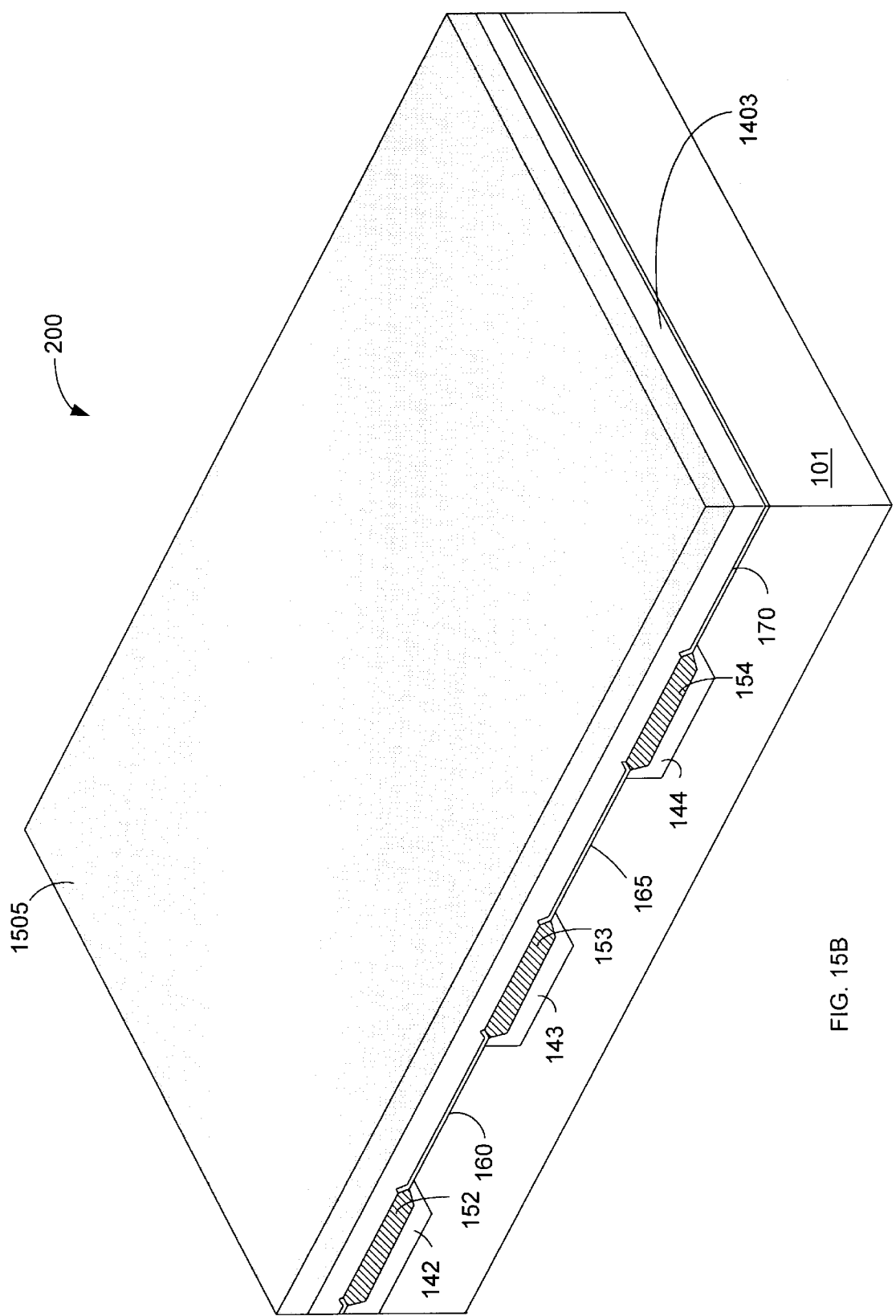
FIG. 15B is an isometric view of illustrating a salicide step used to fabricate the semiconductor device of FIG. 1 in accordance with one embodiment of the present invention.

A layer of photoresist is then deposited over the resulting structure. This photoresist layer is exposed and developed to form photoresist mask 1500, as illustrated in FIG. 15. Photoresist mask 1500 is patterned to define the gates of the low voltage logic transistors, the high voltage logic transistors in first region 101, and any logic transistors in second region 102. For example, photoresist mask portion 1501 defines the gate 128 of low voltage logic transistor 120. Similarly, photoresist mask portion 1502 defines the gate 138 of high voltage logic transistor 130. For conventional salicide processing, photoresist layer 1500 would be exposed and developed to form photoresist mask portions 1503 and 1504, which define the control gates 180 and 190, respectively, of fieldless array transistor 140 as illustrated in FIG. 15A. However, as explained above, forming the gate structures of floating array transistors using conventional salicide processing steps may lead to short circuits between the diffusion bitlines of fieldless array 200. Thus, in accordance with one embodiment of the present invention, photoresist layer 1500 is not being exposed and developed on a photoresist mask portion 1505 (FIG. 15B) which protects fieldless array 200, which is being formed in region 102. Although not shown, photoresist mask portion 1503 may contain openings to allow processing steps to be performed on logic transistors in region 102. An etch is then performed to remove the portions of polysilicon layer 1401 that are exposed by photoresist mask 1500 (FIG. 16). Polysilicon layer 1401 is etched with a gas mixture of HBr and $Cl_2$ until about 20–30 Å are etched from the gate oxide layer. After the polysilicon etch is completed, photoresist mask 1500 is stripped.

As illustrated in FIG. 17, a photoresist mask 1700 is then formed to protect the fieldless array transistors, and any p-channel transistors (not shown) fabricated in substrate 110. All n-type high voltage and low voltage CMOS transistors are exposed by mask 1700. A lightly doped drain (LDD) implant is performed, thereby implanting N-type impurities into regions 122A, 123A, 132A and 133A as illustrated. These regions are self-aligned with gate electrodes 128 and 138. In the described embodiment, the LDD implant is a four-step phosphorous implant performed in four steps, with each implant having a dosage in the range of 1e13 to 2e13 ions/$cm^2$ (for a total in the range of 4e13 to 8e13 ions/$cm^2$) and an energy of in the range of 20 to 30 KeV. In the described embodiment, each implant has a dosage of about of 1.25e13 ions/$cm^2$ (for a total of 5e13 ions/$cm^2$) and an energy of 20 KeV. The substrate 110 is twisted 90 degrees after each of the steps, and the implant is performed at a high angle of 7degrees in each step, thereby causing the dopant to extend under the edges of the polysilicon lines that are exposed by photoresist mask 1700.

A dielectric layer 1801, having a thickness between 1000–2500 Å, is then deposited over the resulting structure as illustrated in FIG. 18. In the described embodiment, dielectric layer 1801 is silicon oxide, deposited to a thickness of about 1800 Å in accordance with conventional CMOS processing techniques. Dielectric layer 1801 is then etched back in accordance with conventional CMOS processing techniques to form dielectric spacers 129 and 139 as illustrated in FIG. 19.

As illustrated in FIG. 20, a photoresist mask 2000 is then formed to protect the fieldless array transistors and any p-channel transistors (not shown) fabricated in substrate 110. All n-type high voltage and low voltage CMOS transistors are exposed by mask 2000. An N+ source/drain implant is then performed, thereby implanting N-type impurities into regions 122B, 123B, 132B and 133B, as illustrated in FIG. 20. In one embodiment, the N-type impurities are arsenic ions, which are implanted with a dopant density in the range of 2e14 to 6e15 ions/$cm^2$ at an implantation energy in the range of 50 to 100 KeV. In the described embodiment, the N-type impurities are arsenic ions, which are implanted with a dopant density of 4e15 ions/$cm^2$ at an implantation energy of 75 KeV. An anneal step is subsequently performed (during the formation of a dielectric layer that caps the above-described devices), thereby forming source/drain regions 122, 123, 132 and 133 as illustrated in FIG. 21.

In some embodiments, a thin silicon oxide layer having a thickness of approximately 200 angstroms and a thin silicon nitride layer also having a thickness of approximately 200 angstroms is deposited. The thin silicon nitride layer is then patterned using a photolithography step and plasma etched. The remaining portions of the thin silicon nitride layer act as a silicidation protection mask that prevents silicidation in the silicide forming step described below.

A blanket layer of a refractory metal, such as nickel, tungsten, titanium, or cobalt, is sputtered over the upper surface of semiconductor device 100 to create refractory metal layer 2110, as illustrated in FIG. 21. A first silicidizing step is then performed to form metal salicide at those locations where refractory metal layer 2110 overlies silicon. The portions of refractory metal layer 2110 which overlie field oxide 124, border field oxide 150, oxide spacers 129, oxide spacers 139, areas covered by the silicidation protection mask (if used), do not react with these regions and therefore, remain refractory metal.

Figure 22:
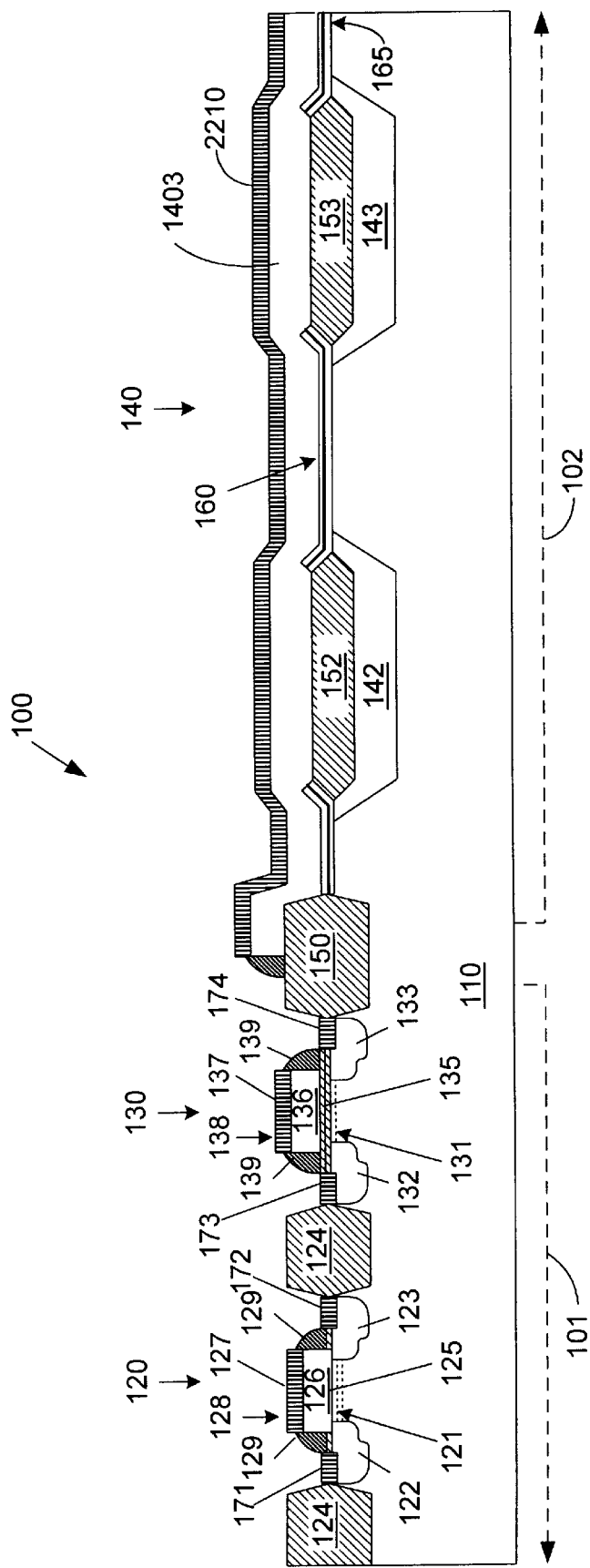
Figure 23:
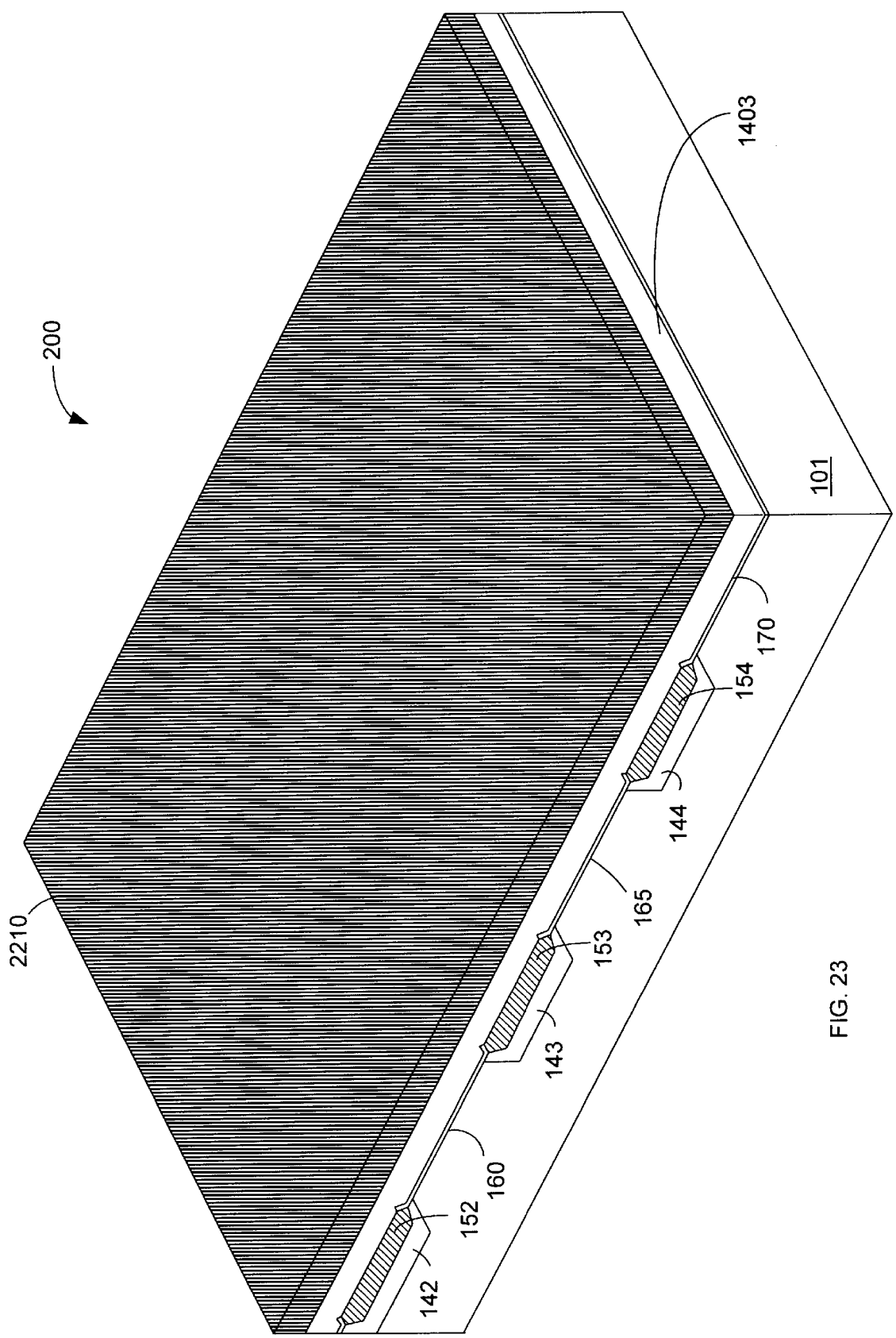
FIGS. 23–25 are isometric views illustrating process steps used to fabricate the semiconductor device of FIG. 1 in accordance with one embodiment of the present invention.

In FIG. 22, a refractory metal etching step removes the unreacted portions of refractory metal layer 2110 to form salicide layers 171, 172, 173, 174, 127, 137, and 2210. A second silicidizing step is performed to reduce the silicide sheet resistance. At this time, logic transistors 120 and 130 are complete. However, as illustrated in FIG. 23, polysilicon layer 1403 and salicide layer 2210 overlies the entire fieldless array. Thus, an additional salicide-polysilicon etching step is performed to form control gates 180 and 190.

Figure 24:
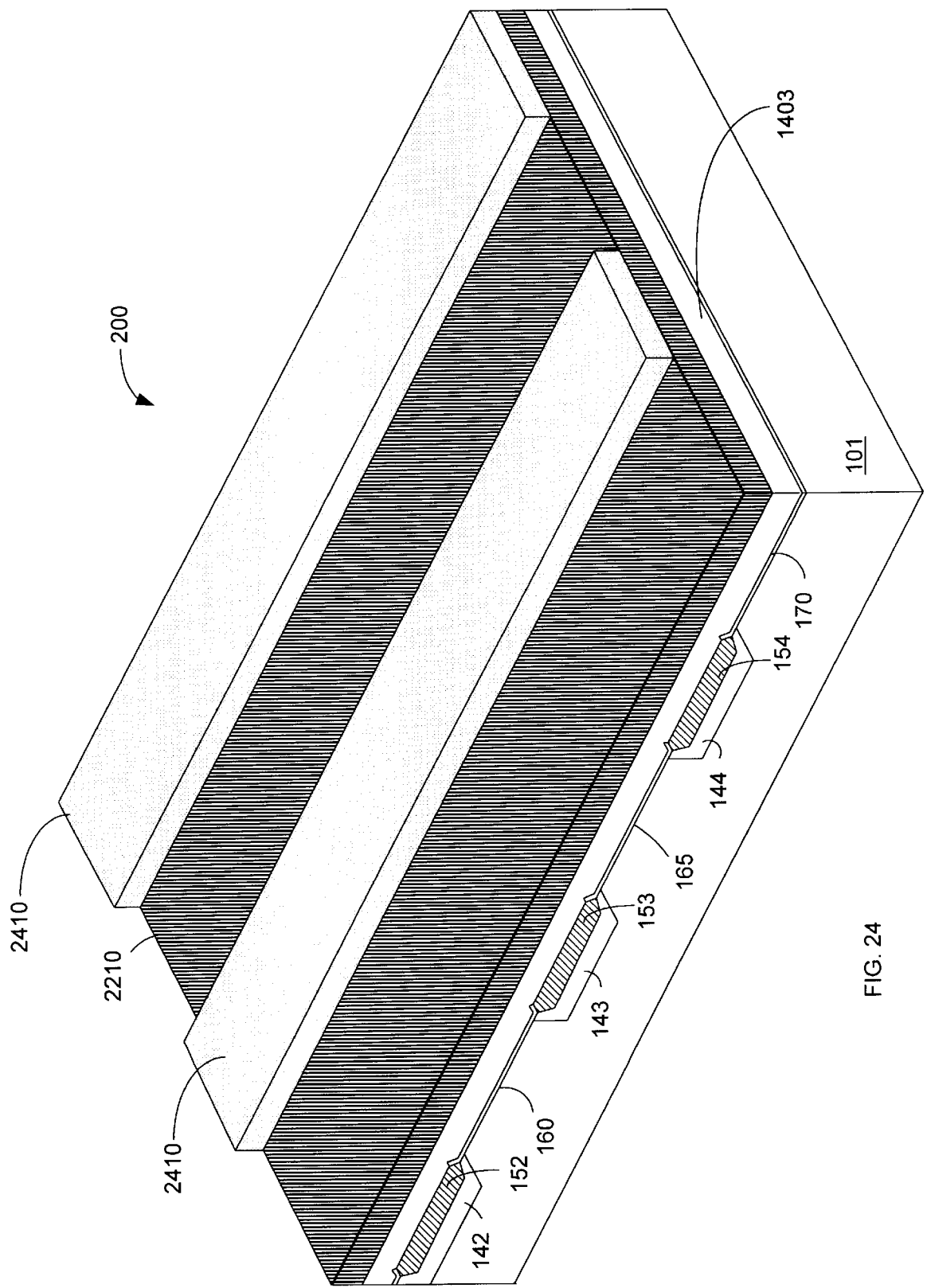

As illustrated in FIG. 24, a layer of photoresist is deposited over the upper surface of semiconductor device 100. This photoresist layer is exposed and developed to create a photoresist mask 2410 that defines word control gates 180 and 190. Although not shown in FIG. 24, photoresist mask 2410 also covers first region 101 of semiconductor device 100. An etching process is then used to remove the uncovered portions of salicide layer 2210 and polysilicon layer 1403. Specifically, in one embodiment, a dry etch is performed by a low pressure high density plasma etcher. Salicide layer 2210 is etched with a gas mixture of $CL_2$ and $N_2$. Then, polysilicon layer 1403 is etched with a gas mixture of HBr, $CL_2$, HE, and $O_2$ until about 10 to 30 angstroms of the upper dielectric layer of floating gate structure 160, 165, and 170 are removed.

Figure 25:
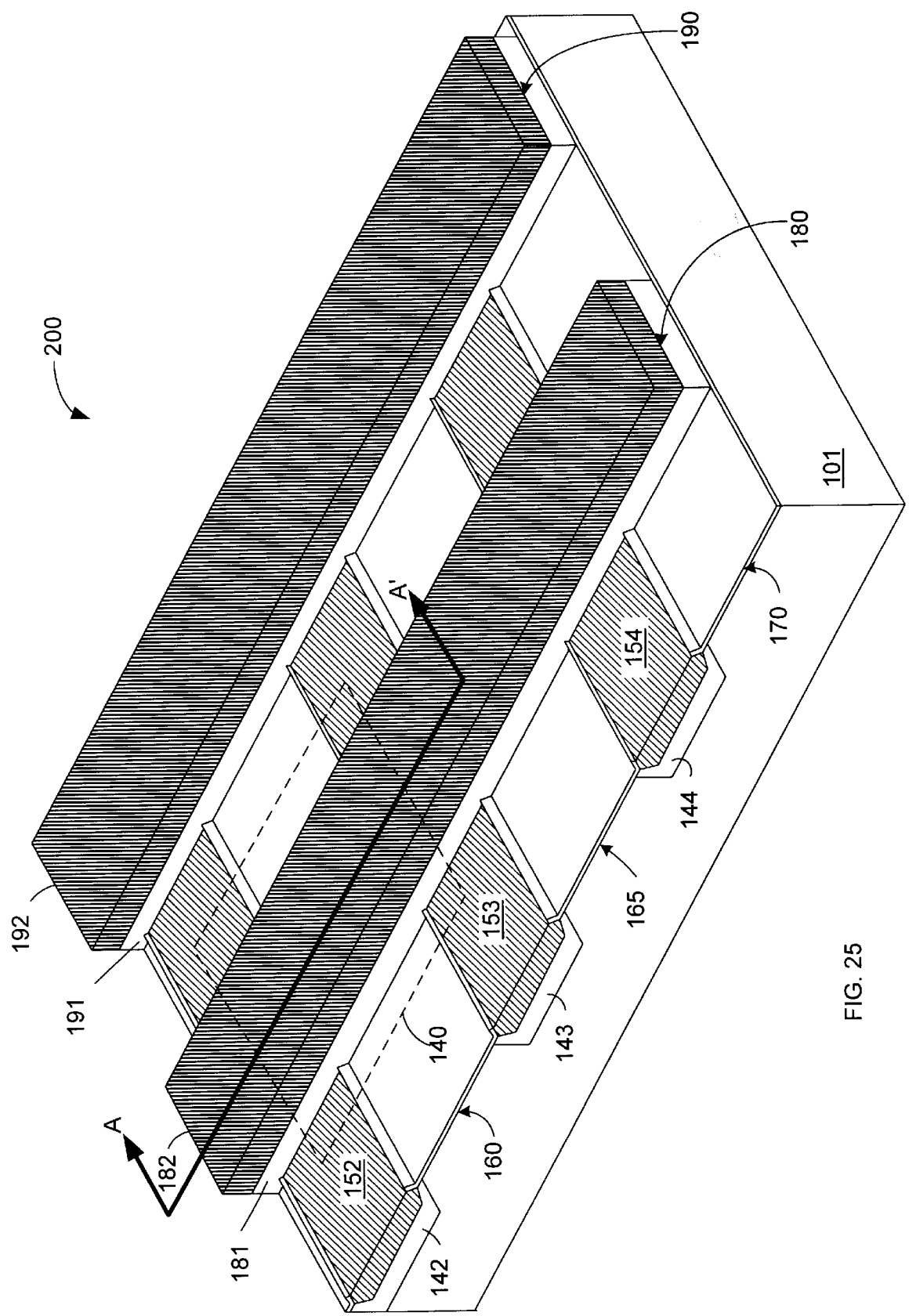

FIG. 25 illustrates the fieldless array portion of semiconductor device 100 after the silicide-polysilicon etch and removal of photoresist mask 2410. Specifically, the silicide-polysilicon etch forms control gate 180 and control gate 190. Control gate 180 comprises polysilicon layer 181 and salicide layer 182, which overlies polysilicon layer 181. Similarly, control gate 190 comprises a polysilicon layer 191 and a silicide layer 192, which overlies polysilicon layer 182. The cross sectional view of FIG. 1 and 22 is taken along the A–A' cut.

In the above-described manner, high voltage CMOS logic transistors, low voltage CMOS logic transistors and fieldless array transistors can be fabricated on a single wafer using an efficient semiconductor process. It is noted that complementary p-channel transistors, whose fabrication has not been described in detail, are also formed on substrate 110 in a manner consistent with the above-described process.

The various embodiments of the structures and methods of this invention that are described above are illustrative only of the principles of this invention and are not intended to limit the scope of the invention to the particular embodiments described. For example, in view of this disclosure, those skilled in the art can define other transistor types, floating gate structures, fieldless arrays, logic transistors, silicides, refractory metals, impurities, implantation voltages, implantation angles, dielectrics, floating gates, and so forth, and use these alternative features to create a method, semiconductor device, or integrated circuit according to the principles of this invention. Thus, the invention is limited only by the following claims.

What is claimed is:

1. A method for forming a semiconductor device having a first region and a second region, said method comprising the steps of:

forming a polysilicon layer over said first region and said second region;

etching a first portion of said polysilicon layer over said first region to form a first polysilicon gate structure for a logic transistor in a logic transistor etching step; and etching a second portion of said polysilicon layer over said second region to form a second polysilicon gate structure for a fieldless array transistors in a fieldless array etching step.

2. The method of claim 1, further comprising the steps of:

depositing a metal layer over said polysilicon layer prior to said step of etching said polysilicon layer over said second region; and silicidizing said metal layer to form a silicide layer where said metal layer contacts said polysilicon layer.

3. The method of claim 2, further comprising the step of silicidizing said silicide layer to reduce a silicide sheet resistance of said silicide layer.

4. The method of claim 1, wherein said first region of said semiconductor device comprises field oxide and said second portion of said semiconductor device comprises a fieldless array of fieldless array transistors.

5. The method of claim 1, further comprising the step of depositing a photoresist layer over said polysilicon layer.

6. The method of claim 5, further comprising the step of developing and exposing said photoresist layer over said first region.

7. The method of claim 1, further comprising the step of implanting impurities into said semiconductor device.

8. The method of claim 1, further comprising the steps of:

creating a first dielectric layer on said semiconductor device;

depositing a floating gate layer on said first dielectric layer; and creating a second dielectric layer on said floating gate layer.

9. The method of claim 8, wherein said step of creating a first dielectric layer on said semiconductor device comprises oxidizing an upper surface of said semiconductor device.

10. The method of claim 8, wherein said step of creating a second dielectric layer on said floating gate layer comprises oxidizing an upper surface of said floating gate layer.

11. The method of claim 8, wherein said floating gate layer is nitride.

12. The method of claim 1, further comprising the step of forming buried bit lines in said second region.

13. The method of claim 12, wherein said step of forming a plurality of buried bit lines in said second region comprises the steps of:

implanting said plurality of bit lines using ion implantation; and creating a plurality of bit line oxide overlying said plurality of buried bit lines.

14. The method of claim 1, further comprising the steps of:

forming a source region in said first region; and forming a drain region in said first region.

15. The method of claim 14, further comprising the step of forming a plurality of oxide spacers in said first region.

* * * * *